United States Patent [19]

Epler et al.

[11] Patent Number: 5,013,684

[45] Date of Patent: May 7, 1991

[54] BURIED DISORDERING SOURCES IN SEMICONDUCTOR STRUCTURES EMPLOYING PHOTO INDUCED EVAPORATION ENHANCEMENT DURING IN SITU EPITAXIAL GROWTH

[75] Inventors: John E. Epler, Cupertino; Thomas L. Paoli, Los Altos, both of Calif.

[73] Assignee: Xerox Corporation, Stamford, Conn.

[21] Appl. No.: 328,214

[22] Filed: Mar. 24, 1989

[51] Int. Cl.$^5$ .............................................. H01L 21/20
[52] U.S. Cl. ...................... 437/129; 148/DIG. 15; 148/DIG. 72; 148/DIG. 94; 148/DIG. 95; 437/26; 437/110; 437/133; 437/160; 437/935; 437/987
[58] Field of Search ................ 148/DIG. 3, 4, 7, 15, 148/30, 32, 35, 38, 56, 65, 72, 71, 90, 94, 95, 160, 169, 33, 33.5; 372/43, 45, 46, 96; 357/16, 17; 437/19, 22, 25, 26, 81, 82, 97, 108, 110, 126, 129, 133, 153, 156, 160, 161, 247, 173, 174, 935, 936, 987

[56] References Cited

U.S. PATENT DOCUMENTS

| | | | |
|---|---|---|---|
| 4,329,660 | 5/1982 | Yano et al. | 372/46 |
| 4,511,408 | 4/1985 | Holonyak, Jr. | 437/129 |
| 4,654,090 | 3/1987 | Burnham et al. | 437/174 |
| 4,771,010 | 9/1988 | Epler et al. | 437/19 |
| 4,810,670 | 3/1989 | Furuyama et al. | 437/129 |
| 4,824,798 | 4/1989 | Burnham et al. | 437/81 |
| 4,830,983 | 5/1989 | Thornton | 437/161 |
| 4,843,032 | 6/1989 | Tokuda et al. | 437/129 |

OTHER PUBLICATIONS

Meehan et al., "Disorder of an AlGaAs-GaAs Superlattice by Donor Diffusion", Appl. Phys. Lett., 45(5), Sep. 1, 1984, pp. 549-551.
Kato et al., "Submicron Pattern Fabrication by Focused Ion Beams", J. Vac. Sci. Technol., B3(1), Jan.-/Feb. 1985, pp. 50-53.
Thornton et al., "Highly Efficient, Long Lived AlGaAs Lasers Fabricated by Silicon Impurity Induced Disordering", Appl. Phys. Lett., 49(3), Jul. 21, 1986, pp. 133-134.
W. D. Goodhue et al., "Planar Quantum Wells with Spatially Dependent Thicknesses and Al Content", *Journal of Vacuum Science and Technology B*, vol. 6(3), pp. 846-849, May/Jun. 1988.
H. Tanaka et al., "Single-Longitudinal-Mode Self Aligned AlGa(As) Double-Heterostructure Lasers Fabricated by Molecular Beam Epitaxy", *Japanese Journal of Applied Physics*, vol. 24, pp. L89-L90, 1985.
A. C. Warren et al., "Masked, Anisotropic Thermal Etching and Regrowth for In Situ Patterning of Compound Semiconductors", *Applied Physics Letters*, vol. 51(22), pp. 1818-1820, Nov. 30, 1987.

*Primary Examiner*—Olik Chaudhuri
*Assistant Examiner*—William D. Bunch
*Attorney, Agent, or Firm*—William Propp

[57] ABSTRACT

In situ removal of selected or patterned portions of semiconductor layers is accomplished by induced evaporation enhancement to form patterned buried impurity layers in semiconductor devices, such as heterostructure lasers and array lasers, which function as buried impurity induced layer disordering (BIILD) sources upon subsequent annealing. These layers may be formed to either function as buried impurity induced layer disordering (BIILD) sources or function as a reverse bias junction configuration of confining current to the active region of a laser structure. Their discussion here is limited to the first mentioned function.

21 Claims, 3 Drawing Sheets

BURIED DISORDERING SOURCES IN SEMICONDUCTOR STRUCTURES EMPLOYING PHOTO INDUCED EVAPORATION ENHANCEMENT DURING IN SITU EPITAXIAL GROWTH

GOVERNMENT RIGHTS

The Government has certain rights in this invention pursuant to Contract No. 86F173100 awarded by the Defense Advanced Research Projects Agency (DARPA).

CROSS-REFERENCE TO RELATED APPLICATIONS

This application contains subject matter that is related to subject matter of patent application Ser. No. 07/257,498, filed Oct. 13, 1988, patent application Ser. No. (D/88222Q), filed Mar. 24, 1989 and patent application Ser. No. (D/88222Q1), filed Mar. 24, 1989, both assigned to the same assignee herein and are incorporated herein by reference thereto.

BACKGROUND OF THE INVENTION

This invention relates generally to semiconductor laser structures and more particularly to laser structures having internal sources for forming, during growth or during anneal treatment after growth, buried impurity induced layer disordered (BIILD) regions that function as optical and current confinement mechanisms for such laser structures.

The employment of impurity induced layer disordering (IILD) is well known in the art for fabricating after growth buried or confined active regions in such semiconductor laser devices. However, there is no report or disclosure known by us that attempts or contemplates the fabrication and patterning of such sources in situ during growth. What is desired is a process, particularly as implemented in either MBE or MOCVD, wherein layer patterning can be achieved in situ without growth interruption by some off-line or nongrowth procedure or process.

There are two examples known to us where patterning may be achieved by quasi-in situ thermal processing wherein thermal etching is employed to selectively remove GaAs. In one example, a n-GaAs layer over a p-AlGaAs layer is first, selectively chemically etched in a particular region followed by thermal etching to remove the remaining thin GaAs left from chemical etching before proceeding with regrowth of the p-AlGaAs layer. This forms a buried reverse biased current confinement mechanism in a double heterostructure laser. H. Tanaka et al, "Single-Longitudinal-Mode Self Aligned AlGa(As) Double-Heterostructure Lasers Fabricated by Molecular Beam Epitaxy", *Japanese Journal of Applied Physics*, Vol. 24, pp. L89-L90, 1985. In the other example, a GaAs/AlGaAs heterostructure partially masked by a metallic film is thermally etched in an anisotropic manner illustrating submicron capabilities for device fabrication. A. C. Warren et al, "Masked, Anisotropic Thermal Etching and Regrowth for In Situ Patterning of Compound Semiconductors", *Applied Physics Letters*, Vol. 51(22), pp. 1818-1820, Nov. 30, 1987. In both of these examples, AlGaAs masking layers are recognized as an etch stop to provide for the desired geometric configuration in thermally etched GaAs, although it is also known that, given the proper desorption parameters, AlGaAs may also be thermally etched at higher temperatures with different attending ambient conditions vis a vis GaAs.

However, none of these techniques employ in situ photo induced evaporation as a technique in a film deposition system to incrementally reduce, on a minute scale, film thickness in patterned or selective locations at the growth surface either during or after film growth, producing smooth sculptured surface morphology which is a principal objective of this invention.

It is another object of this invention to bring about in situ removal or desorption of selected surface regions or layers of compound semiconductors employing induced evaporation enhancement in metalorganic chemical vapor deposition (MOCVD) epitaxy and to apply this method in the fabrication of buried optical waveguides or buried heterojunction lasers and laser arrays formed via buried impurity induced layer disordering (BIILD).

SUMMARY OF THE INVENTION

According to this invention, in situ removal or thinning of portions or all of selected regions of deposited films are brought about by a technique employing an irradiation energy source directed to a spot or region of exposure on the growth surface of a substrate or support in a deposition reactor system, e.g., a MBE or MOCVD system. This technique, termed "induced evaporation enhancement", is taught in patent application Ser. No. 07/257,498 filed Oct. 13, 1988. In particular, the invention herein is directed to the employment of this technique in fabricating in situ buried disordering sources in heterostructure structures, such as lasers and array lasers wherein induced evaporation enhancement purely removes or prevents the continued growth of the epitaxially deposited materials in selected regions at the growth surface without the need or introduction of masking or chemical etching processes. The application of this technique, as particularly described here, provides the opportunity to extend the process of impurity induced layer disordering (IILD) to a process we term buried impurity induced layer disordering (BIILD) wherein a disordering source is patterned in situ during fabrication of the structure. Such an approach does not require top surface introduction of impurity disordering species after the completion of all epitaxial growth, as has been the case in all past IILD processing.

An important aspect of this invention is that traditional IILD becomes part of or integrated into the epitaxial growth process with actual impurity disordering of selected or patterned buried regions of a semiconductor structure occurring concurrently with such growth processes.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

In describing the devices of this invention, reference is generally made to individual discrete structures although it is generally the case that a plurality of such devices would be fabricated on a wafer substrate in a MOCVD reactor wherein the processing laser beam would be scanned and/or modulated to selected locations to perform the desired induced evaporation enhancement in patterned fashion across the wafer surface. Also, many of the structures disclosed contain a separate confinement cavity for the active region for purposes of illustration, which is not a specific requirement in the exercise of this invention.

Figure 1:
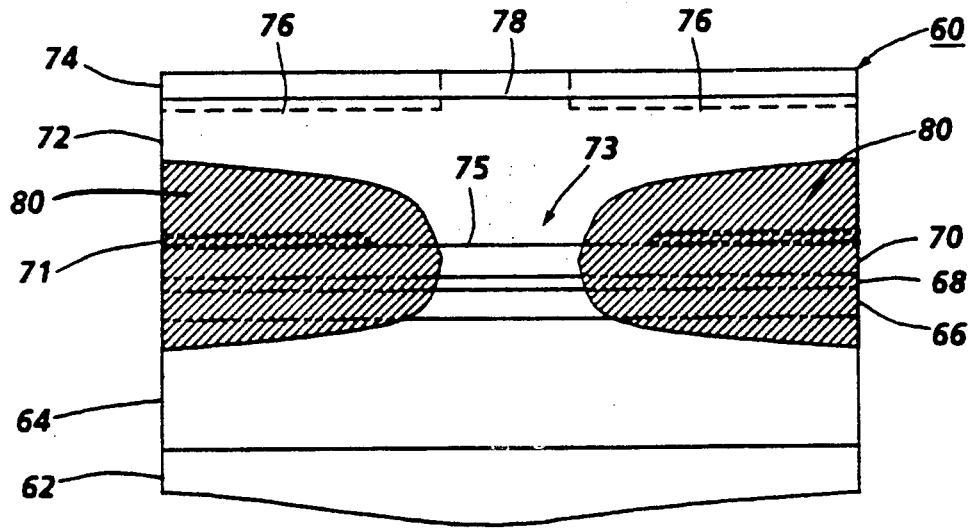
FIG. 1 is a schematic illustration of a side elevation of a heterostructure laser with a buried disordering source which initially functions as a disordering source during growth and upon subsequent annealing produce a buried active region with optical and carrier confinement.
Figure 2:
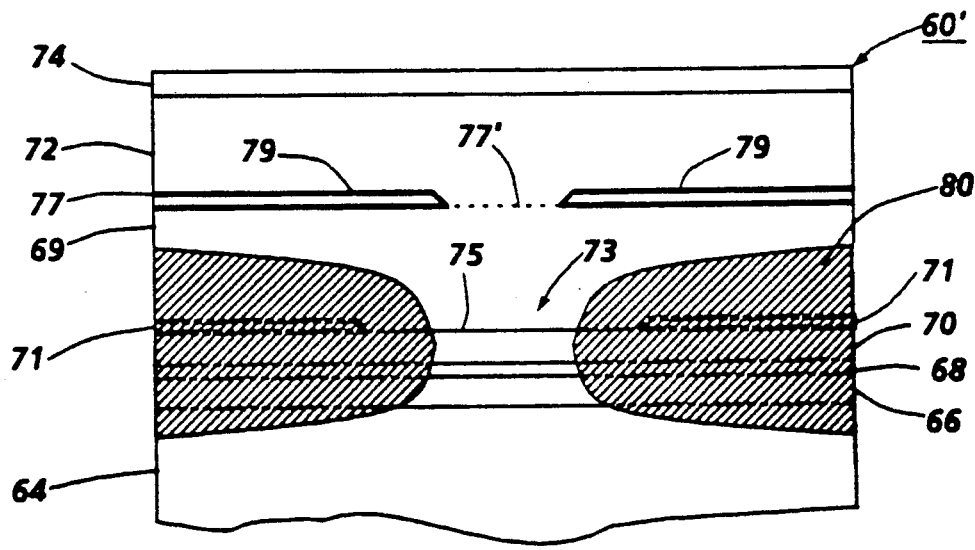
FIG. 2 is a schematic illustration of a side elevation of a heterostructure laser with a buried active region like that shown in FIG. 1 in combination with buried back biased current confinement formed in an upper cladding layer.

Reference is now made to FIGS. 1 and 2 wherein there is disclosed laser structures incorporating buried impurity induced layer disordering (BIILD) sources which are selectively patterned to bring about an expected patterned diffusion upon subsequent epitaxial growth or thermal annealing. In FIG. 1, laser 60 comprises substrate 62 of n-GaAs upon which is epitaxially deposited outer confinement layer 64 of n-$Al_xGa_{1-x}As$, inner confinement waveguide layer 66 of n-$Al_yGa_{1-y}As$ where $x>y$, active region 68 of undoped, or p-type doped or n-type doped layer or layers and may comprise a relatively thin conventional double heterostructure (DH) active layer or a single quantum well of either GaAs or $Al_zGa_{1-z}As$ where $x>y>z$, or a multiple quantum well structure of alternating well layers of GaAs or $Al_zGa_{1-z}As$ and corresponding barrier layers of either AlAs or $Al_{z'}Ga_{1-z'}As$, where $x>y>z'>z$, inner cladding layer 70 of p-$Al_yGa_{1-y}As$ and n-type doped QW source layer 71 which comprises n-GaAs heavily doped, for example, with Si or Se at a concentration in excess of $10^{19}/cm^3$ or up to a point of saturated concentration of the Si or Se elemental constituent in GaAs. Layer 71 is shown bolder to emphasize its higher dopant property. Layer 71 may be very thin, i.e. of quantum well (QW) size such as 7.5 nm, and may also be, alternatively alone or in alternate combination therewith, a Si or Se spike or sheet comprising one or more atomic submonolayers or monolayers thick, i.e., purely an internally deposited impurity source of Si or Se in the manner contemplated and suggested in patent application Ser. No. 07/029,297, filed Mar. 23, 1987, assigned to the assignee herein and incorporated herein by reference thereto.

After the growth of source layer 71, epitaxial growth is temporarily discontinued, the metalorganic sources are vented, a 1% arsine/hydrogen mixture is introduced into the MOCVD chamber and a laser beam is focussed to the central region of layer 71 to provide a temperature gradient sufficient to induce the desorption of a strip in QW n-GaAs layer 71 down to interface 75 with inner cladding layer 70 forming a channel 73 in layer 71. The $Al_4Ga_{1-4}As$ layer 70 functions as a desorption stop to the optical patterned desorption at channel 73 because AlGaAs is much more difficult to desorb compared to GaAs in employing the technique of induced evaporation enhancement. The substrate temperature during the desorption may be increased from 800° C. to 825° C. or 850° C. to reduce the laser power required for removal. The portion of the GaAs layer 71 desorbed in the region of channel 73 being very thin, such as in the range of 5 to 10 nm, may be removed in a relatively short period of time, e.g., several hundreds of seconds. Experience has shown that a 7.5 nm thick QW layer can be removed in about 300 seconds.

If the temperature is changed during the desorption process, then the temperature at the growth region is returned to 800° C. and growth is continued with the epitaxial growth of outer confinement layer 72 of p-$Al_4Ga_{1-4}As$, where $x\geq A>y>z'>z$, followed by the growth of cap layer 74 of p+-GaAs. Proton bombardment or ion implant is then employed to form high resistance regions 76 to define narrow current confinement stripe 78 over channel 73. During the growth of these last two layers 72 and 74, the temperature at the growth region of the laser structure is generally sufficient to cause impurity induced diffusion of impurity species, such as Si or Se, from source layer 71 with the interdiffusion of Ga and Al and the formation of disordering regions 80 as illustrated in cross section FIG. 1.

The disordering source 71 is, therefore, activated by some combination of annealing that will occur during remaining crystal growth on the structure containing the impurity source and/or can be carried out in an annealing step in the reactor after crystal growth is complete or can be carried out in an annealing furnace after the structure is removed from the reactor as is commonly now practiced.

It should be noted that the structure of FIG. 1 without current application functions effectively as a buried transparent waveguide structure with radiation propagating in channel 73.

Laser 60' in FIG. 2 is the same structure as laser 60 of FIG. 1 except that there is also included reverse biased junction layer 77 in the upper cladding region of the device. Lasers 60 and 60' provide in situ formed DH structures with buried active regions formed during the growth of the laser structures with laser 60' including a reverse biased junction configuration 79 having a current confinement channel 77' also formed in situ during the growth of the laser structure. Because of the current confinement configuration 79, the current confinement at 78 in FIG. 1 is not necessary for FIG. 2.

After the epitaxial growth of confinement layer 69 of p-$Al_4Ga_{1-4}As$, n-type doped QW layer 77 comprising n-GaAs heavy doped, for example, with Si or Se at a concentration of $10^{19}/cm^3$, as represented by the bold lines outlining this layer, is grown on the surface of layer 69. Layer 77 may be, for example, about 7.5 nm thick.

After the growth of layer 77, the growth is temporarily discontinued, the temperature of the substrate may be increased, the metalorganic sources are vented, a 1% arsine/hydrogen mixture is introduced into the MOCVD chamber and a laser beam is focussed to the central region of layer 77 to provide a temperature gradient sufficient to induce the desorption of a strip in the n-GaAs layer down to the interface with confinement layer 69 forming a channel 77' in layer 77. The $Al_4Ga_{1-4}As$ layer 69 functions as a desorption stop to the optically patterned desorption at 77' because AlGaAs is more difficult to desorb compared to GaAs. In the example here, for a period of 100 seconds, GaAs is desorbed at channel 77' at a rate of about 0.1 nm/s with a temperature of approximately 1030° C. from a focussed laser spot.

After removal of channel 77' by induced evaporation enhancement, the temperature at the growth region is again returned to the normal deposition temperature and epitaxial growth is continued with the growth of second outer confinement layer 72 of p-Al$_B$Ga$_{1-B}$As where $x \geq A \geq B > y > z' > z$, followed by the growth of cap layer 74 of p+-GaAs.

Disordering source 71 is shown in FIGS. 1 and 2 at the interface with inner confinement layer 70. This layer need only be in proximity of active region 68 to provide for disordering of the optical cavity region comprising layers 66, 68 and 70 as well as possibly parts of outer confinement layers 64 and 72. As an example, source layer 71 may also be positioned at the interface of either inner confinement layers 66 or 70 with active region 68 or at the interface between inner confinement layer 66 and outer confinement layer 64.

Figure 3:
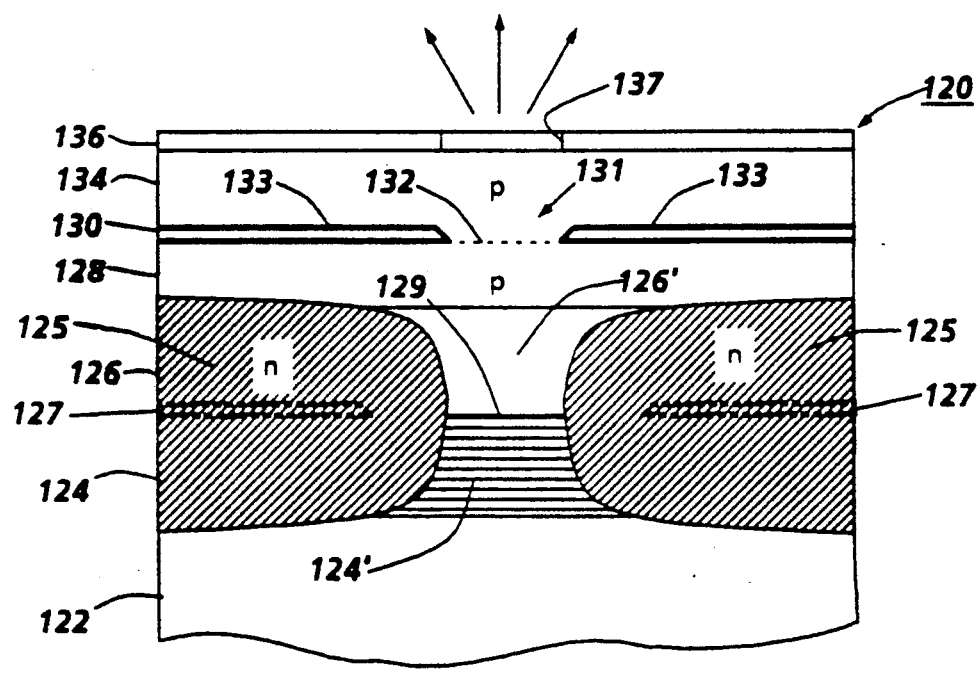
FIG. 3 is a schematic illustration of a side elevation of a surface emitting heterostructure laser formed according to this invention.
Figure 4:
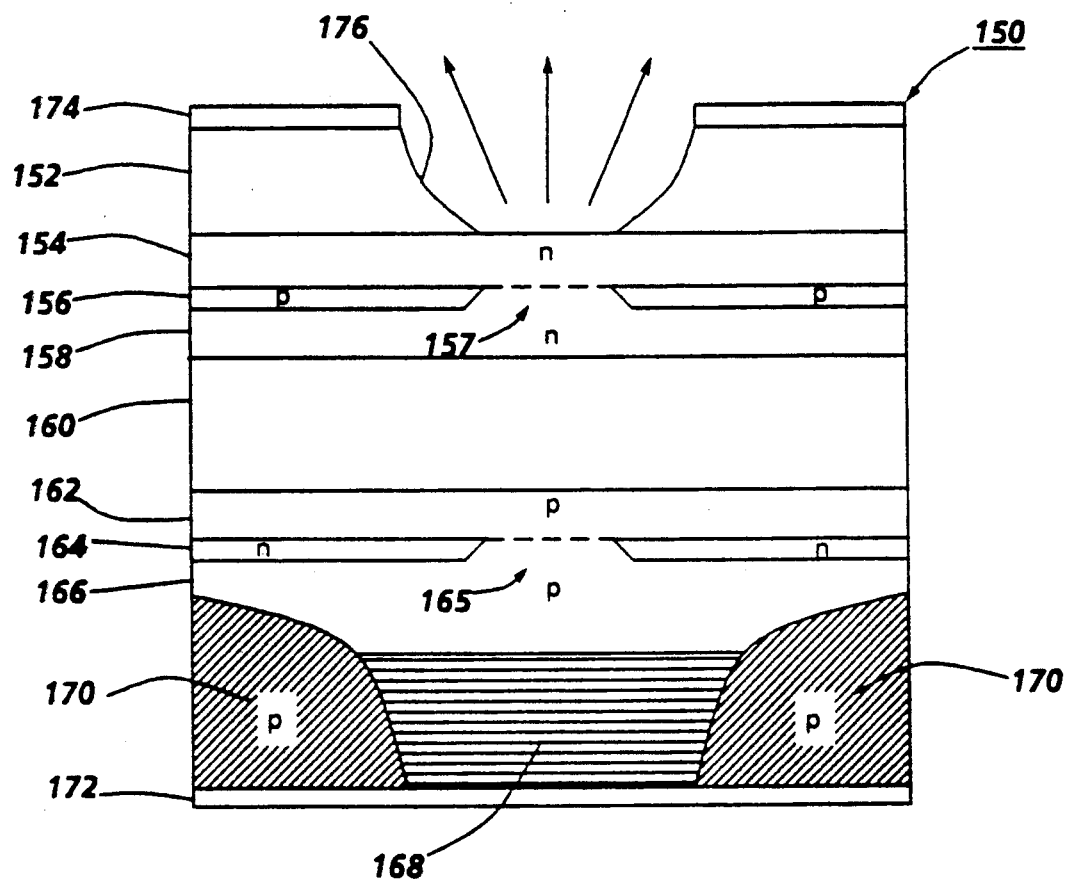
FIG. 4 is a schematic illustration of a side elevation of another surface emitting heterostructure laser formed according to this invention.

Reference is now made to FIGS. 3 and 4 which disclose surface emitting devices of the type similar to those originally disclosed in U.S. Pat. No. 4,309,670, issued Jan. 5, 1982. Induced evaporation enhancement provides an excellent means for the formation of this class of devices where the Fabry-Perot cavity is transverse to the plane of the p-n junction of the device.

Laser 120 in FIG. 3 comprises an n-GaAs substrate 122 of n-GaAs followed by the epitaxial deposition of DBR 124 comprising alternating layers of Al$_w$Ga$_{1-w}$As and Al$_u$Ga$_{1-u}$As where $w > u$. DBR 124, as optically and current confined by subsequently created impurity induced layer disordered regions 125, will function as a mirror for optical feedback for laser structure 120.

After the growth of DBR 124, an impurity source layer 127 is grown comprising n-GaAs heavily doped, for example, with Si or Se at a concentration in excess of $10^{19}/cm^3$ or up to a point of saturated concentration of the Si or Se elemental constituent in GaAs. Layer 127 is shown bolder to emphasize its higher dopant property. Layer 127 may be very thin, i.e. of quantum well (QW) size such as 7.5 nm, and may also be, alternatively alone or in alternate combination therewith, a Si or Se spike comprising one or more atomic monolayers thick. After the growth of of source layer 127, epitaxial growth is temporarily discontinued, the temperature of the substrate is increased if necessary, the metalorganic sources are vented, a 1% arsine/hydrogen mixture is introduced into the MOCVD chamber and a laser beam is focussed to the central region of layer 127 to provide a temperature gradient sufficient to induce the desorption of a circular spot in the source layer 127 down to interface 129 with DBR 124 forming a circular aperture or opening in layer 127. The temperature at the growth region is then returned to normal epitaxial growth with the epitaxial growth of relatively thick active region 126 of undoped, or p-type doped or n-type doped layer or layers and may comprise a relatively thick conventional double heterostructure (DH) active layer or a multiple quantum well structure of alternating well layers of GaAs or Al$_z$Ga$_{1-z}$As and corresponding barrier layers of either AlAs or Al$_{z'}$Ga$_{1-z'}$As, where $x > y > z' > z$, cladding layer 128 of p-Al$_y$Ga$_{1-y}$As and, then, n-type doped QW layer 130 which comprises n-GaAs heavy doped, for example, with Si or Se at a concentration of $10^{19}/cm^3$, which layer may be about 7.5 nm thick.

During this continued growth of layers 126, 128 and 130, the formation of impurity induced disordered regions 125 will commence and continue to occur due to the high growth temperature, causing the impurity Si or Se in source layer 127 to diffuse into surrounding regions of active region 126 and DBR 124. As a result, and upon completion of final growth of laser 120, disordered region 125 will be fully formed and encompass remaining regions 124' and 126' or may be extended to cover these regions via a subsequent annealing step in the reactor.

It should be noted that it may be necessary to have more than one source layer 127, such as, for example, another source layer above layer 127 midway in active region 126 or one or more source layers 127 between layers of DBR 124, in order to obtain a sufficient disordering profile to include thick active region 126 and DBR 124 as exemplified by disordered regions 125.

After the growth of layer 130, the growth is again temporarily discontinued, the temperature of the substrate may be increased, the metalorganic sources are vented, a 1% arsine/hydrogen mixture is introduced into the MOCVD chamber and a laser beam spot is focussed to the central region of layer 130 to provide a temperature gradient sufficient to induce the desorption of a circular aperture in the n-GaAs layer down to interface 132 with layer 128 forming a circular aperture 131 in layer 130.

After removal of region 131 by induced evaporation enhancement, the temperature at the growth region is returned to normal epitaxial growth with the growth of second confinement layer 134 of p-Al$_B$Ga$_{1-B}$As where $x \geq A \geq B > y > z' > z$, followed by the growth of cap layer 136 of p+-GaAs. An aperture 137 is formed in cap layer 136 so that the propagating radiation is not absorbed by this GaAs contact layer or the cap layer is of p+AlGaAs, for example, Al$_{0.5}$Ga$_{0.95}$As.

Disordered regions provide for optical and current confinement to active regions 126' and DBR 124' and further current confinement is provided along the Fabry-Perot cavity by current confinement configuration 133.

Reference is now made to FIG. 4 wherein the surface emitter laser 150 has a structure similar to the laser structure shown in FIG. 3 except that the order of epitaxial growth is reversed relative to the substrate so that the DBR is the last structure epitaxially grown rather than the first. With the DBR on top, optical and current confinement can be achieved employing IILD without employing a buried disordered source.

Laser 150 comprises substrate 152 of n-GaAs upon which is grown an outer cladding layer 154 of n-Al$_x$Ga$_{1-x}$As followed by reverse biased junction layer 156 of p-GaAs. After the growth of layer 156, epitaxial growth is temporarily discontinued, the metalorganic sources are vented, a 1% arsine/hydrogen mixture is introduced into the MOCVD chamber and a laser beam is focussed to the central region of layer 156 to provide a temperature gradient sufficient to induce the desorption of a circular spot in this p-GaAs layer down to its interface with layer 154 forming a circular aperture 157 in layer 156 for current channeling.

Epitaxial growth is continued with the growth of inner cladding layer 158 comprising n-Al$_x$Ga$_{1-x}$As followed by the growth of thick active region 160 of undoped, or p-type doped or n-type doped layer or layers and may comprise a relatively thick conventional double heterostructure (DH) active layer or a multiple quantum well structure of alternating well layers of GaAs or Al$_z$Ga$_{1-z}$As and corresponding barrier layers of either AlAs or $Al_{z'}Ga_{1-z'}As$, where $x>y>z'>z$, inner cladding layer 162 of $p-Al_yGa_{1-y}As$ and reverse biased junction layer 164 of n-GaAs. Both reverse bias junction layers 156 and 164 may be heavily doped quantum well layers.

After the growth of reverse biased junction layer 164, the growth is again temporarily discontinued, the metal-organic sources are vented, a 1% arsine/hydrogen mixture is introduced into the MOCVD chamber and the laser beam spot is focussed to the central region of layer 164 to provide a temperature gradient sufficient to induce the desorption of a circular opening in the n-GaAs layer down to interface with layer 162 forming a circular aperture 165 in layer 164 which is approximately concentric with aperture 157.

After removal of region 165 by induced evaporation enhancement, the epitaxial growth is continued with the growth of outer confinement layer 166 of $p-Al_yGa_{1-y}As$ followed by the epitaxial deposition of DBR 168 comprising alternating layers of undoped $Al_wGa_{1-w}As$ and $Al_uGa_{1-u}As$ where $w>u$. Following the growth of DBR 168, an IILD is performed on DBR 168 forming disordered regions 170 employing, for example, a high Zn concentration. Disordered regions 170 provides for (1) optical confinement to the central portion of DBR 168, (2) current confinement outside central portion of DBR 168 so that the undoped DBR 168 contains no free carriers with current injection through disordered regions 170 into layer 166 and (3) functioning as a reflector for optical feedback for the propagating radiation.

Surface emitter 150 is completed by an annular aperture 176 etched through the highly absorbent GaAs substrate 152 to provide for surface emission and the deposit of metal contacts 172 and 174.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. The method of forming buried impurity sources in a semiconductor structure comprising the steps of:
   epitaxially depositing several semiconductor layers on a substrate, at least one of said layers containing a concentration of an impurity species between $10^{19}$ and the point of saturated concentration of said impurity species in said one layer,
   interrupting the epitaxial growth of said semiconductor layers after the deposition of said one layer,
   selectively desorbing in situ portions of said one layer to the interface with the layer therebeneath employing photo induced evaporation, and
   continuing the epitaxial deposition of remaining layers inducing at least initial impurity disordering of regions of deposited layers in proximity to the remaining portions of said one layer.

2. The method of forming buried impurity sources in a semiconductor structure comprising the steps of:
   epitaxially depositing several semiconductor layers on a substrate, at least some layers have different elemental constituents relative to other layers, at least one of said layers containing a high concentration of an impurity species sufficient to bring about induced impurity layer disordering to layers in close proximity to said one layer containing a high concentration of an impurity species under proper disordering conditions,
   interrupting the epitaxial growth of said semiconductor layers after the deposition of said one layer containing a high concentration of said impurity species,
   selectively desorbing in situ portions of said one layer containing a high concentration of said impurity species to the interface with the layer therebeneath employing photo induced evaporation, and
   continuing the epitaxial deposition of remaining layers inducing at least initial impurity disordering of regions of deposited layers in proximity to the remaining portions of said one layer containing a high concentration of said impurity species.

3. In the method of forming buried impurity sources in a semiconductor structure of claim 2 wherein said one layer containing a high concentration of said impurity species comprises an ultra thin layer of quantum well size and doped with said impurity species at a concentration between $10^{19}$ and the point of saturated concentration of said impurity species in said one layer containing a high concentration of said impurity species.

4. In the method of forming buried impurity sources in a semiconductor structure of claim 3 wherein said one layer containing a high concentration of said impurity species comprises GaAs and said impurity species comprises Si and Se.

5. In the method of forming buried impurity sources in a semiconductor structure of claim 2 wherein a doping sheet comprising a atomic submonolayer or more of said impurity species is deposited on at least one surface of said one layer containing a high concentration of said impurity species.

6. In the method of forming buried impurity sources in a semiconductor structure of claim 2 wherein a doping sheet comprising a atomic submonolayer, monolayer or more of said impurity species is deposited on opposite surfaces of said one layer containing a high concentration of said impurity species.

7. In the method of forming buried impurity sources in a semiconductor structure of claim 2 wherein there is a plurality of said quantum well layers doped with said impurity species, a plurality of doping sheets comprising an atomic submonolayer, monolayer or more of said impurity species, said doping sheets alternated with said quantum well layers.

8. The method of forming buried impurity sources in a semiconductor structure comprising the steps of:
   epitaxially depositing several semiconductor layers on a substrate, at least some layers have different elemental constituents relative to other layers, at least one of said layers containing a high concentration of an impurity species sufficient to bring about induced impurity layer disordering to layers in close proximity to said one layer containing a high concentration of an impurity species under proper disordering conditions,
   interrupting the epitaxial growth of said semiconductor layers after the deposition of said one layer containing a high concentration of said impurity species,
   patterning in situ portions of said one layer containing a high concentration of said impurity species to the interface with the layer therebeneath, and
   continuing the epitaxial deposition of remaining layers inducing at least initial impurity disordering of regions of deposited layers in proximity to the remaining portions of said one layer containing a high concentration of said impurity species.

9. In the method of forming buried impurity sources in a semiconductor structure of claim 8 wherein said one layer containing a high concentration of said impurity species comprises an ultra thin layer of quantum well size and doped with said impurity species at a concentration between $10^{19}$ and the point of saturated concentration of said impurity species in said one layer containing a high concentration of said impurity species.

10. In the method of forming buried impurity sources in a semiconductor structure of claim 9 wherein said one layer containing a high concentration of said impurity species comprises GaAs and said impurity species comprises Si and Se.

11. In the method of forming buried impurity sources in a semiconductor structure of claim 8 wherein a doping sheet comprising a atomic submonolayer or more of said impurity species is deposited on at least one surface of said one layer containing a high concentration of said impurity species.

12. In the method of forming buried impurity sources in a semiconductor structure of claim 8 wherein a doping sheet comprising a atomic submonolayer, monolayer or more of said impurity species is deposited on opposite surfaces of said one layer containing a high concentration of said impurity species.

13. In the method of forming buried impurity sources in a semiconductor structure of claim 8 wherein there is a plurality of said quantum well layers doped with said impurity species, a plurality of doping sheets comprising an atomic submonolayer, monolayer or more of said impurity species, said doping sheets alternated with said quantum well layers.

14. The method of forming buried impurity sources in a semiconductor laser structure comprising the steps of:
    epitaxially depositing several semiconductor layers on a substrate, said layers including an active region for light wave generation and propagation under lasing conditions, at least one of said layers intermediate of the other layers and in proximity to said active region containing a high concentration of an impurity species sufficient to bring about induce impurity layer disordering to layers in close proximity thereto under proper disordering conditions,
    interrupting the epitaxial growth of said semiconductor layers after the deposition of said one layer containing a high concentration of said impurity species,
    patterning in situ portions of said one layer containing a high concentration of said impurity species to the interface with the layer therebeneath, and
    continuing the epitaxial deposition of remaining layers inducing at least initial impurity disordering of regions of deposited layers in proximity to the remaining portions of said one layer containing a high concentration of said impurity species and producing in situ a buried active region.

15. In the method of forming buried impurity sources in a semiconductor laser structure of claim 14 wherein said one layer containing a high concentration of said impurity species comprises an ultra thin layer of quantum well size and doped with said impurity species at a concentration between $10^{19}$ and the point of saturated concentration of said impurity species in said one layer containing a high concentration of said impurity species.

16. In the method of forming buried impurity sources in a semiconductor laser structure of claim 15 wherein said one layer containing a high concentration of said impurity species comprises GaAs and said impurity species comprises Si and Se.

17. In the method of forming buried impurity sources in a semiconductor laser structure of claim 14 wherein a doping sheet comprising a atomic submonolayer or more of said impurity species is deposited on at least one surface of said one layer containing a high concentration of said impurity species.

18. In the method of forming buried impurity sources in a semiconductor laser structure of claim 14 wherein a doping sheet comprising a atomic submonolayer, monolayer or more of said impurity species is deposited on opposite surfaces of said one layer containing a high concentration of said impurity species.

19. In the method of forming buried impurity sources in a semiconductor laser structure of claim 14 wherein there is a plurality of said quantum well layers doped with said impurity species, a plurality of doping sheets comprising an atomic submonolayer, monolayer or more of said impurity species, said doping sheets alternated with said quantum well layers.

20. In the method of forming buried impurity sources in a semiconductor laser structure of claim 14 further comprising the step of:
    forming in situ a buried current confinement means in close proximity to said buried active region, said buried current confinement means comprising a reverse bias junction configuration containing a current channel therein in approximate alignment with said buried active layer.

21. The method of forming impurity sources in a surface emitting semiconductor laser structure comprising the steps of:
    epitaxially depositing several semiconductor layers on a substrate, said layers including an active region for light wave generation and propagation under lasing conditions with a Fabry-Perot cavity transverse to the planar extent of said active region, a surface emission region at one end of said cavity and a DBR formed at the other end of said cavity to function as a reflector for optical feedback for propagating radiation,
    forming in situ a buried current confinement means in close proximity to said buried active region, said buried current confinement means comprising a reverse bias junction configuration containing a current channel therein in approximate alignment with said buried active layer,
    impurity induced disordering of said DBR outside the region of said cavity to form regions to provide for both optical confinement for propagating radiation in said cavity and current injection means to said active region.

* * * * *